(12) United States Patent
Liao et al.

(10) Patent No.: US 9,065,390 B2
(45) Date of Patent: Jun. 23, 2015

(54) RADIO FREQUENCY FRONT-END CIRCUIT FOR RECEIVER AND LOW NOISE AMPLIFIER THEREOF

(71) Applicants: Hua-Yu Liao, New Taipei (TW); Cheng-Yu Wang, Taipei (TW); Ying-Tang Chang, Hsinchu (TW)

(72) Inventors: Hua-Yu Liao, New Taipei (TW); Cheng-Yu Wang, Taipei (TW); Ying-Tang Chang, Hsinchu (TW)

(73) Assignee: Shenzhen South Silicon Valley Microelectronics Co., Ltd., Shen Zhen (CN)

( * ) Notice: Subject to any disclaimer, the term of this patent is extended or adjusted under 35 U.S.C. 154(b) by 59 days.

(21) Appl. No.: 13/941,546

(22) Filed: Jul. 15, 2013

(65) Prior Publication Data

US 2014/0120856 A1 May 1, 2014

(30) Foreign Application Priority Data

Oct. 31, 2012 (TW) .............................. 101140339 A

(51) Int. Cl.
| | |
|---|---|
| H04B 1/16 | (2006.01) |
| H03F 3/193 | (2006.01) |
| H03F 3/45 | (2006.01) |
| H04B 1/26 | (2006.01) |

(52) U.S. Cl.
CPC ............ *H03F 3/193* (2013.01); *H03F 3/45188* (2013.01)

(58) Field of Classification Search
CPC .............................. H04B 1/28; H03F 3/45071
USPC ............................................ 455/334; 330/252
See application file for complete search history.

(56) References Cited

U.S. PATENT DOCUMENTS

| 8,145,176 B2 | 3/2012 | Dijkmans et al. | |
|---|---|---|---|
| 2006/0284679 A1* | 12/2006 | Roine | 330/253 |
| 2011/0267144 A1* | 11/2011 | Behera et al. | 330/260 |

FOREIGN PATENT DOCUMENTS

| TW | 200945772 | 11/2009 |
|---|---|---|
| TW | 201115912 | 5/2011 |

OTHER PUBLICATIONS

"Office Action of Taiwan Counterpart Application", issued on Mar. 24, 2015, p. 1-p. 11, in which the listed references were cited.

\* cited by examiner

*Primary Examiner* — Lee Nguyen

(74) *Attorney, Agent, or Firm* — Jianq Chyun IP Office

(57) ABSTRACT

A RF front-end circuit and a low noise amplifier thereof configured for a receiver are provided. The circuit includes a low noise amplifier and a quadrature passive mixer. The low noise amplifier provides two RF output differential signals to the quadrature passive mixer. The RF signals are down-converted to the differential in-phase baseband signals and the differential quadrature-phase baseband signals. The structure of the RF front-end circuit can avoid the signal and noise interfering between in-phase channel and quadrature-phase channel without using a 25% duty cycle local oscillation generator circuit.

20 Claims, 5 Drawing Sheets

RADIO FREQUENCY FRONT-END CIRCUIT FOR RECEIVER AND LOW NOISE AMPLIFIER THEREOF

CROSS-REFERENCE TO RELATED APPLICATION

This application claims the priority benefit of Taiwan application serial no. 101140339, filed on Oct. 31, 2012. The entirety of the above-mentioned patent application is hereby incorporated by reference herein and made a part of this specification.

BACKGROUND

1. Technical Field

The invention relates to a radio frequency front-end circuit for a receiver and low noise amplifier thereof.

2. Related Art

A radio frequency (RF) front-end circuit for receiver is mainly applied in a communication system, which amplifies a signal received from an antenna to facilitate signal process. Since the signal comes from the antenna is very weak, the RF front-end circuit is generally closed to the antenna to minimize a signal loss on the transmission line. Such configuration is widely used in receiver of a wireless communication system, etc., for example, a wireless local area network (WLAN) or a global positioning system (GPS), etc. In some real applications, a low noise amplifier applied in the receiver is followed by a quadrature passive mixer, which mixes and converts the RF signal received from the antenna into a baseband signal then pass to next stage. According to the existing technique, the quadrature passive mixer followed by the low noise amplifier shares the differential RF signal from the low noise amplifier output, and converts the differential RF signal into a differential in-phase baseband signal and a differential quadrature-phase baseband signal. However, a 25% duty cycle local oscillation generator has to be used to avoid the signal and noise interfering between in-phase channel and quadrature-phase channel, so as to avoid the degradation of signal to noise ratio.

SUMMARY

The invention is directed to a radio frequency (RF) front-end circuit for a receiver, a low noise amplifier of the RF front-end circuit provides two differential RF output signals to a quadrature passive mixer, such that the quadrature passive mixer does not share the RF signal from the low noise amplifier output, and can avoid signal and noise interfering between an in-phase channel and a quadrature-phase channel without using a 25% duty cycle local oscillation generator.

The invention provides a RF front-end circuit, configured for a receiver, includes a low noise amplifier and a quadrature passive mixer. The low noise amplifier has a first input node, a second input node, a first output node, a second output node, a third output node and a fourth output node. The low noise amplifier receives a first and second RF input signal differential to each other through the first and second input node, and respectively outputs a first to fourth RF output signal through the first to fourth output node. The quadrature passive mixer is coupled to the first to fourth output nodes of the low noise amplifier, and respectively receives the first to fourth RF output signal, and mixes with a local oscillation signal to obtain a first to fourth baseband signal.

The invention provides a low noise amplifier having a first to fourth output node, and includes a main differential input pair, a main tail current source module, a first and second sub differential pair. The main differential input pair has a common node, a first and second input nodes and a first and second differential nodes, where the first and second input nodes of the main differential input pair respectively receive a first and second RF input signal differential to each other. The main tail current source module is coupled between the common node of the main differential input pair and the ground. The first sub differential pair has a common node, a first and second input nodes and a first and second differential nodes, where the common node of the first sub differential pair is coupled to the first differential node of the main differential input pair, the first differential node of the first sub differential pair is coupled to a first output impedance and the first output node of the low noise amplifier, and the second differential node of the first sub differential pair is coupled to a second output impedance and the third output node of the low noise amplifier. The second sub differential pair has a common node, a first and second input nodes and a first and second differential nodes, where the common node of the second sub differential pair is coupled to the second differential node of the main differential input pair, the first differential node of the second sub differential pair is coupled to a third output impedance and the second output node of the low noise amplifier, and the second differential node of the second sub differential pair is coupled to a fourth output impedance and the fourth output node of the low noise amplifier.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
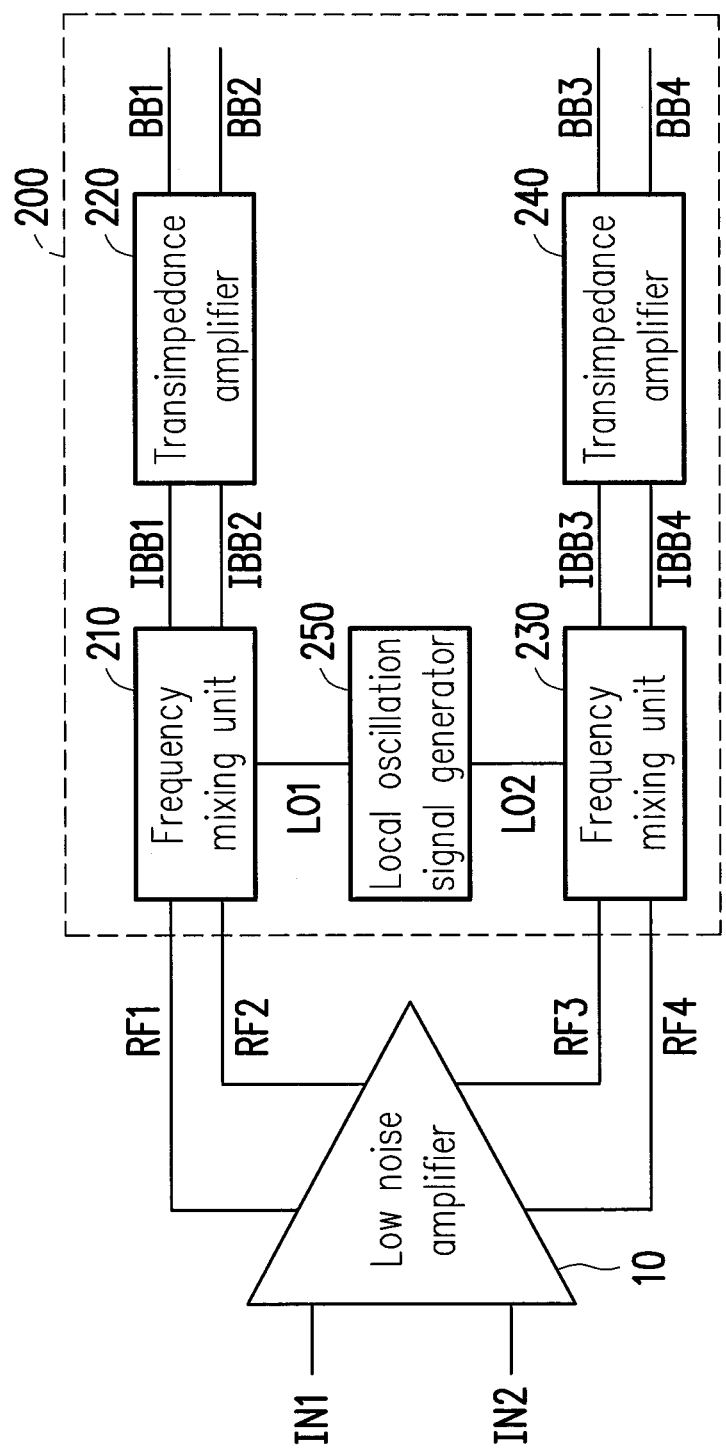
FIG. 1 is a functional block diagram of a radio frequency (RF) front-end circuit for a receiver according to an embodiment of the invention.

FIG. 1 is a functional block diagram of a radio frequency (RF) front-end circuit for a receiver according to an embodiment of the invention. Referring to FIG. 1, the RF front-end circuit 20 includes a low noise amplifier 10 and a quadrature passive mixer 200. The low noise amplifier 10 has a first input node, a second input node, a first output node, a second output node, a third output node and a fourth output node. The low noise amplifier 10 receives a first and second RF input signal IN1, IN2 differential to each other through the first and second input node, and respectively outputs a first to fourth RF output signal RF1-RF4 through the first to fourth output node.

The quadrature passive mixer 200 is coupled to the first to fourth output node of the low noise amplifier, and respectively receives the first to fourth RF output signals RF1-RF4, and mix with a local oscillation signal to obtain baseband signals BB1-BB4.

In the present embodiment, the quadrature passive mixer 200 includes frequency mixing units 210, 230, transimpedance amplifiers 220, 240 and a local oscillation signal generator 250. In the present embodiment, the local oscillation signal includes a first local oscillation signal LO1 and a second local oscillation signal LO2, which are respectively generated by the local oscillation signal generator 250 and transmitted to the frequency mixing units 210, 230.

The frequency mixing unit 210 receives the RF output signals RF1, RF2 and mixes with the first local oscillation signal LO1 and an inverted signal of LO1 to obtain baseband current signals IBB1, IBB2. The transimpedance amplifier 220 is coupled to the frequency mixing unit 210, and receives the baseband current signals IBB1, IBB2 and outputs the baseband signals BB1, BB2. The frequency mixing unit 230 receives the RF output signals RF3, RF4 and mixes with the second local oscillation signal LO2 and an inverted signal of LO2 to obtain baseband current signals IBB3, IBB4. The transimpedance amplifier 240 is coupled to the frequency mixing unit 230, and receives the baseband current signals IBB3, IBB4 and outputs the baseband signals BB3, BB4.

Figure 2:
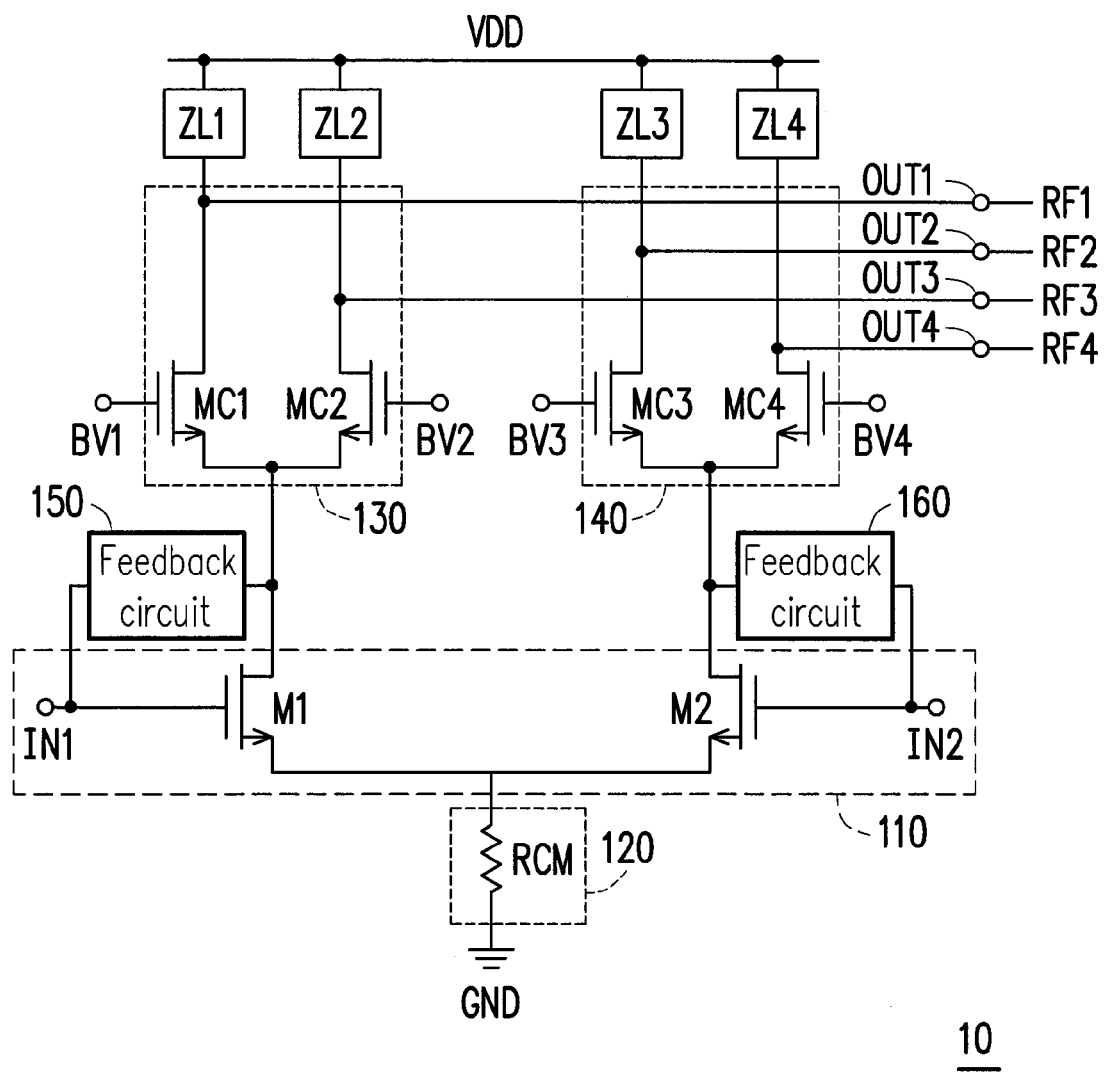
FIG. 2 is a circuit diagram of a low noise amplifier according to an embodiment of the invention.

FIG. 2 is a circuit diagram of a low noise amplifier according to an embodiment of the invention, which is a detailed implementation of the low noise amplifier 10 of the embodiment of FIG. 1. Referring to FIG. 2, the low noise amplifier 10 has output nodes OUT1-OUT4, and includes a main differential input pair 110, a main tail current source module 120, a first sub differential pair 130 and a second sub differential pair 140. The main differential input pair 110 has a common node, a first and second input nodes and a first and second differential nodes, where the first and second input nodes of the main differential input pair 110 respectively receive a first RF input signal IN1 and a second RF input signal IN2 differential to each other. The main tail current source module 120 is coupled between the common node of the main differential input pair 110 and the ground GND. In the present embodiment, the main tail current source module 120 includes a resistor RCM, though implementation of the main tail current source module 120 is not limited thereto.

The first sub differential pair 130 has a common node, a first and second input nodes and a first and second differential nodes, where the common node of the first sub differential pair 130 is coupled to the first differential node of the main differential input pair 110, the first differential node of the first sub differential pair 130 is coupled to a first output impedance ZL1 and the first output node OUT1 of the low noise amplifier 10, and the second differential node of the first sub differential pair 130 is coupled to a second output impedance ZL2 and the third output node OUT3 of the low noise amplifier 10.

The second sub differential pair 140 has a common node, a first and second input nodes and a first and second differential nodes, where the common node of the second sub differential pair 140 is coupled to the second differential node of the main differential input pair 110, the first differential node of the second sub differential pair 140 is coupled to a third output impedance ZL3 and the second output node OUT2 of the low noise amplifier 10, and the second differential node of the second sub differential pair 140 is coupled to a fourth output impedance ZL4 and the fourth output node OUT4 of the low noise amplifier 10.

In the present embodiment, the main differential input pair 10 includes a first main transistor M1 and a second main transistor M2. A drain of the first main transistor M1 is coupled to the first differential node of the main differential input pair 110, and a source thereof is coupled to the common node of the main differential input pair 110. A gate of the first main transistor M1 is coupled to the first input node of the main differential input pair 110 for receiving the first RF input signal IN1. A drain of the second main transistor M2 is coupled to the second differential node of the main differential input pair 110, and a source thereof is coupled to the common node of the main differential input pair 110. A gate of the second main transistor M2 is coupled to the second input node of the main differential input pair 110 for receiving the second RF input signal IN2.

In the present embodiment, the first sub differential pair 130 includes a first sub transistor MC1 and a second sub transistor MC2, and the second sub differential pair 140 includes a third sub transistor MC3 and a fourth sub transistor MC4. A gate of the first sub transistor MC1 receives a first sub differential pair bias BV1, a drain of the first sub transistor MC1 is coupled to the first differential node of the first sub differential pair 130, and a source of the first sub transistor MC1 is coupled to the common node of the first sub differential pair 130.

A gate of the second sub transistor MC2 receives a second sub differential pair bias BV2, a drain of the second sub transistor MC2 is coupled to the second differential node of the first sub differential pair 130, and a source of the second sub transistor MC2 is coupled to the common node of the first sub differential pair 130.

On the other hand, the second sub differential pair 140 includes a third sub transistor MC3 and a fourth sub transistor MC4. A gate of the third sub transistor MC3 receives a third sub differential pair bias BV3, a drain of the third sub transistor MC3 is coupled to the first differential node of the second sub differential pair 140, and a source of the third sub transistor MC3 is coupled to the common node of the second sub differential pair 140. A gate of the fourth sub transistor MC4 receives a fourth sub differential pair bias BV4, a drain of the fourth sub transistor MC4 is coupled to the second differential node of the second sub differential pair 140, and a source of the fourth sub transistor MC4 is coupled to the common node of the second sub differential pair 140.

Referring to FIG. 2, in the present embodiment, the low noise amplifier 10 includes output impedances ZL1-ZL4, which are respectively coupled between the first differential node of the first sub differential pair 130 and a power VDD, between the second differential node of the first sub differential pair 130 and the power VDD, between the first differential node of the second sub differential pair 140 and the power VDD, and between the second differential node of the second sub differential pair 140 and the power VDD. The output impedances ZL1-ZL4 are mainly used to amplify signals and adjust the voltage between the power VDD and the first, second differential nodes of the sub differential pairs 130, 140. Impedance values of the output impedances ZL1-ZL4 and whether the output impedances are implemented or not are determined according to an actual requirement of implementation, the invention is not limited thereto.

When the low noise amplifier 10 receives the first RF input signal IN1 and the second RF input signal IN2 differential to each other from the main differential input pair 110, through amplification of the low noise amplifier 10, the low noise amplifier 10 respectively outputs the first to fourth RF output signals RF1-RF4 through the output nodes OUT1-OUT4, where the first RF output signal RF1 and the second RF output signal RF2 have a phase difference of 180 degrees, and the third RF output signal RF3 and the fourth RF output signal RF4 have a phase difference of 180 degrees.

In the present embodiment, the low noise amplifier 10 further includes a first and second feedback circuit 150 and 160, which are respectively coupled between the first input node and the first differential node and between the second input node and the second differential node of the main differential input pair 110, i.e. between the drain and the gate of the main transistor M1 and between the drain and the gate of the main transistor M2. The first and second feedback circuits 150 and 160 are used to improve stability of the low noise amplifier 10, and are further used to adjust the equivalent input impedances seeing into the low noise amplifier 10 from the input nodes IN1-IN2.

Figure 3A:
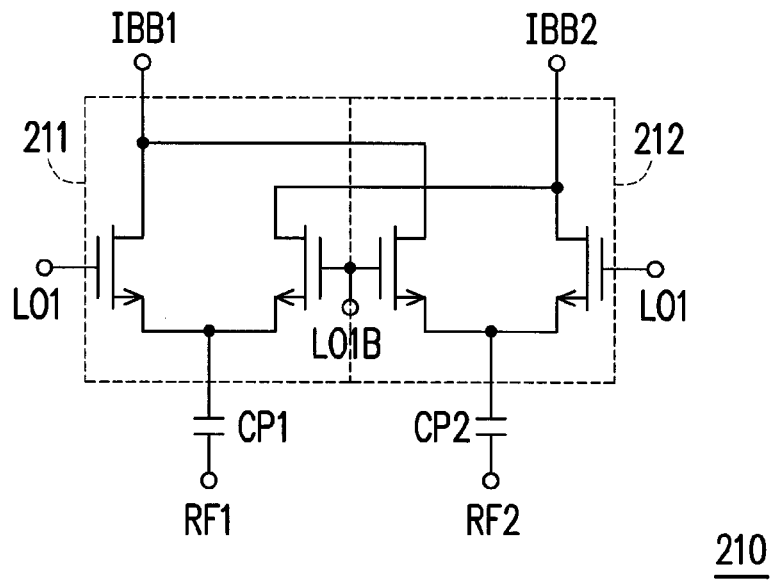
FIG. 3A and FIG. 3B are circuit diagrams of frequency mixing units according to an embodiment of the invention.
Figure 3B:
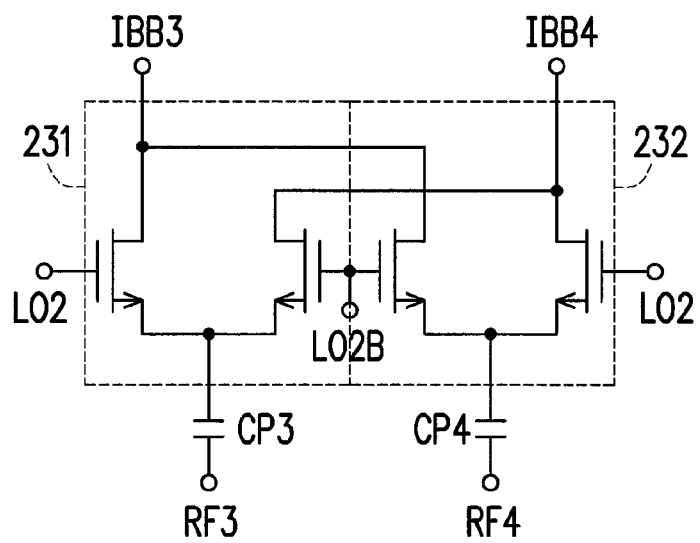

FIG. 3A and FIG. 3B are circuit diagrams of frequency mixing units according to an embodiment of the invention, which respectively correspond to the frequency mixing units 210, 230 of the embodiment of FIG. 1. Referring to FIG. 3A, the frequency mixing unit 210 includes a first and second differential pair 211, 212, which respectively have a common node, a first and second control nodes and a first and second differential nodes. The common node of the first differential pair 211 receives the first RF output signal RF1 through a capacitor CP1, the first control node of the first differential pair 211 receives the first local oscillation signal LO1, and the second control node of the first differential pair 211 receives an inverted signal LO1B of the first local oscillation signal LO1.

Similarly, the common node of the second differential pair 212 receives the second RF output signal RF2 through a capacitor CP2. The first control node of the second differential pair 212 receives the inverted signal LO1B, and the second control node of the second differential pair 212 receives the first local oscillation signal LO1. The frequency mixing unit 210 mixes the first and second RF output signal RF1, RF2 with the local oscillation signal LO1 and the inverted signal LO1B thereof by using the differential pairs 211, 212 to produce the baseband current signals IBB1, IBB2.

Similarly, referring to FIG. 3B, the frequency mixing unit 230 includes a third and fourth differential pair 231 and 232, which respectively have a common node, a first and second control nodes and a first and second differential nodes. The common node of the third differential pair 231 receives the third RF output signal RF3 through a capacitor CP3, the first control node of the third differential pair 231 receives the second local oscillation signal LO2, and the second control node of the third differential pair 231 receives an inverted signal LO2B of the second local oscillation signal LO2.

The common node of the fourth differential pair 232 receives the fourth RF output signal RF4 through a capacitor CP4. The first control node of the fourth differential pair 232 receives the inverted signal LO2B, and the second control node of the fourth differential pair 232 receives the second local oscillation signal LO2. The frequency mixing unit 230 mixes the third and fourth RF output signal RF3, RF4 with the local oscillation signal LO2 and the inverted signal LO2B thereof by using the differential pairs 231 and 232 to produce the baseband current signals IBB3 and IBB4.

Figure 4:
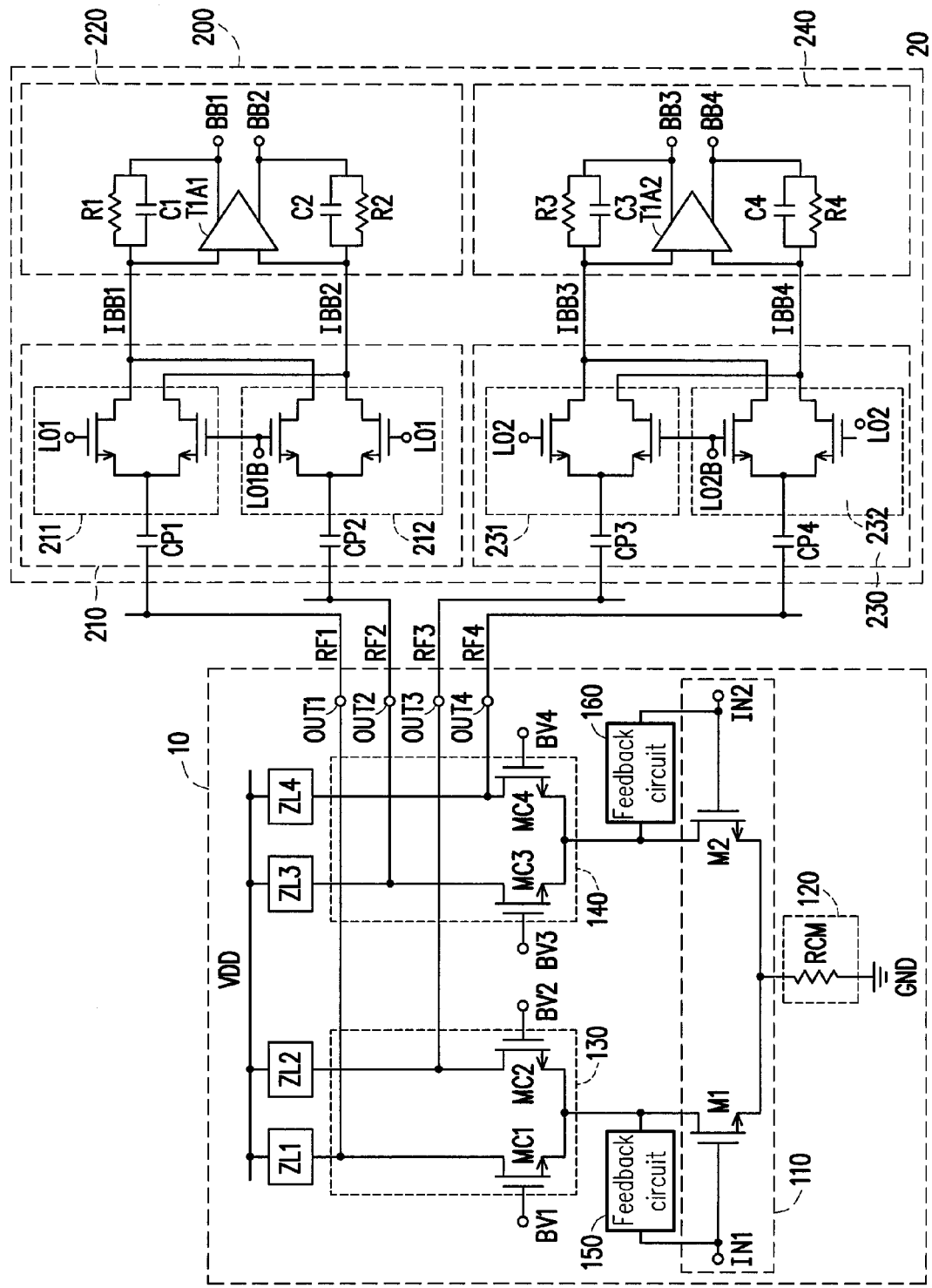
FIG. 4 is a circuit diagram of a RF front-end circuit for a receiver according to an embodiment of the invention.

FIG. 4 is a circuit diagram of a RF front-end circuit for a receiver according to an embodiment of the invention, which provides a more detailed implementation compared to that of the embodiment of FIG. 1. It should be noticed that since the circuit is complicated, the local oscillation signal generator 250 is omitted in FIG. 4, and the frequency mixing units 210, 230 still receive the first local oscillation signal LO1 and the second local oscillation signal LO2 and the respective inverted signals thereof from the local oscillation signal generator 250.

Referring to FIG. 4, the RF front-end circuit 20 includes the low noise amplifier 10 and the quadrature passive mixer 200, where coupling relations of various components in the low noise amplifier and detailed operation content thereof can refer to related descriptions in the embodiment of FIG. 1, which are not repeated. The quadrature passive mixer 200 is coupled to the first to fourth output nodes OUT1-OUT4 of the low noise amplifier 10 to respectively receive the first to fourth RF output signals RF1-RF4. The quadrature passive mixer 200 respectively mixes the first to fourth RF output signals RF1-RF4 with the local oscillation signal to obtain the first to fourth baseband signals BB1-BB4. Coupling relations and operations of various components in the quadrature passive mixer 200 are described in detail below.

Referring to FIG. 4, the same to the embodiment of FIG. 1, the local oscillation signal includes the first local oscillation signal LO1 and the second local oscillation signal LO2, and the quadrature passive mixer 200 includes the first frequency mixing unit 210, the first transimpedance amplifier 220, the second frequency mixing unit 230, and the second transimpedance amplifier 240. The first frequency mixing unit 210 further includes the first and second differential pair 211 and 212, which respectively have the common node, the first and second control nodes and the first and second differential nodes. The common node of the first differential pair 211 receives the first RF output signal RF1, the first control node of the first differential pair 211 receives the first local oscillation signal LO1, and the second control node of the first differential pair 211 receives the inverted signal LO1B. The first and second differential nodes of the first differential pair 211 are coupled to the first transimpedance amplifier 220.

Similarly, the common node of the second differential pair 212 receives the second RF output signal RF2. The first control node of the second differential pair 212 receives the inverted signal LO1B, and the second control node of the second differential pair 212 receives the first local oscillation signal LO1. The first and second differential nodes of the second differential pair 212 are coupled to the first transimpedance amplifier 220.

The first transimpedance amplifier 220 includes an operational amplifier TIA1, resistors R1, R2 and capacitors C1, C2. The operational amplifier TIA1 has a first and second input nodes, and a first and second output nodes. The resistor R1 and the capacitor C1 are coupled between the first input node and the first output node of the operational amplifier TIA1, and the resistor R2 and the capacitor C2 are coupled between the second input node and the second output node of the operational amplifier TIA1. It should be noticed that in the present embodiment, the capacitors and the resistors coupled between the first input node and the first output node and between the second input node and the second output node are respectively one resistor and one capacitor (the resistor R1 and the capacitor C1, and the resistor R2 and the capacitor C2), and the number of the capacitors and the resistors and impedance/capacitance values thereof are all determined according to an actual requirement, the invention is not limited thereto.

The first differential pair 211 receives the first RF output signal RF1 through the common node, and mixes the first RF output signal RF1 with the first local oscillation signal LO1 and the inverted signal LO1B to generate the first baseband current signal IBB1. The second differential pair 212 receives the second RF output signal RF2 through the common node, and mixes the second RF output signal RF2 with the first local oscillation signal LO1 and the inverted signal LO1B to generate the second baseband current signal IBB2. The first frequency mixing unit 210 transmits the first and second baseband current signal IBB1, IBB2 to the first transimpedance amplifier 220, and after buffer processing, the first transimpedance amplifier 220 respectively outputs the first and second baseband signal BB1, BB2 through the first and second output node.

On the other hand, the second frequency mixing unit 230 further includes the third and fourth differential pair 231, 232, which respectively have the common node, the first and second control nodes and the first, and second differential nodes. The common node of the third differential pair 231 receives the third RF output signal RF3, the first control node of the third differential pair 231 receives the second local oscillation signal LO2, and the second control node of the third differential pair 231 receives the inverted signal LO2B. The first and second differential nodes of the third differential pair 231 are coupled to the second transimpedance amplifier 240.

Similarly, the common node of the fourth differential pair 232 receives the fourth RF output signal RF4. The first control node of the fourth differential pair 232 receives the inverted signal LO2B, and the second control node of the fourth differential pair 232 receives the second local oscillation signal LO2. The first and second differential nodes of the fourth differential pair 232 are coupled to the second transimpedance amplifier 240.

The second transimpedance amplifier 240 includes an operational amplifier TIA2, resistors R3, R4 and capacitors C3, C4. The operational amplifier TIA2 has a first and second input nodes, and first and second output nodes. The resistor R3 and the capacitor C3 are coupled between the first input node and the first output node of the operational amplifier TIA2, and the resistor R4 and the capacitor C4 are coupled between the second input node and the second output node of the operational amplifier TIA2. The number of the capacitors and the resistors and impedance/capacitance values thereof are all determined according to an actual requirement, which is not limited by the invention.

The third differential pair 231 receives the third RF output signal RF3 through the common node, and mixes the third RF output signal RF3 with the second local oscillation signal LO2 and the inverted signal LO2B of the second local oscillation signal LO2 to generate the third baseband current signal IBB3. The fourth differential pair 232 receives the fourth RF output signal RF4 through the common node, and mixes it with the second local oscillation signal LO2 and the inverted signal LO2B to generate the fourth baseband current signal IBB4. The second frequency mixing unit 230 transmits the third and fourth baseband current signal IBB3, IBB4 to the second transimpedance amplifier 240, and after buffer processing, the second transimpedance amplifier 240 respectively outputs the third and fourth baseband signal BB3, BB4 through the first and second output node.

In general practice, the first and second local oscillation signals LO1, LO2 have a phase difference of 90 degrees therebetween, and the first and second local oscillation signals LO1, LO2 respectively have a phase difference of 180 degrees with the inverted signals LO1B, LO2B thereof, such that phase differences between the first to the fourth baseband signals BB1-BB4 obtained after frequency mixing and down-conversion are all multiples of 90 degrees. For example, the first to the fourth baseband signals BB1-BB4 respectively have phase differences of 0 degree, 180 degrees, 90 degrees and 270 degrees. A following circuit (not shown) coupled to the first and second transimpedance amplifier 220, 240 can further use the first to the fourth baseband signals BB1-BB4 having phase differences to perform signal processing.

It should be noticed that in the present embodiment, in order to further eliminate mutual interference between the signals (for example, the RF output signals RF1-RF4) and the quadrature channel noise generated during transmission, the quadrature passive mixer 200 further includes capacitors CP1-CP4, which are respectively coupled between the first to fourth differential pairs 211, 212, 231, 232 and the first to fourth output nodes OUT1-OUT4 of the low noise amplifier 10. Capacitance values of the capacitors CP1-CP4 and whether the capacitors are implemented or not are determined according to an actual requirement.

Figure 5A:
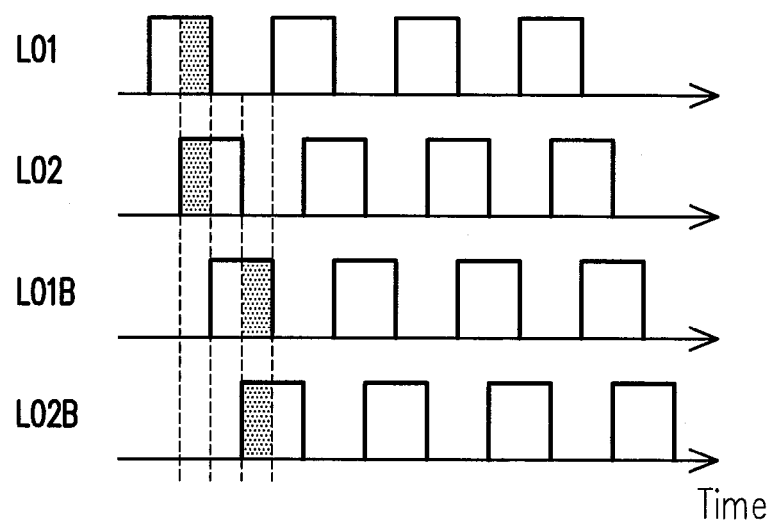
FIG. 5A and FIG. 5B are relationship diagrams of local oscillation signals and duty cycles thereof.
Figure 5B:
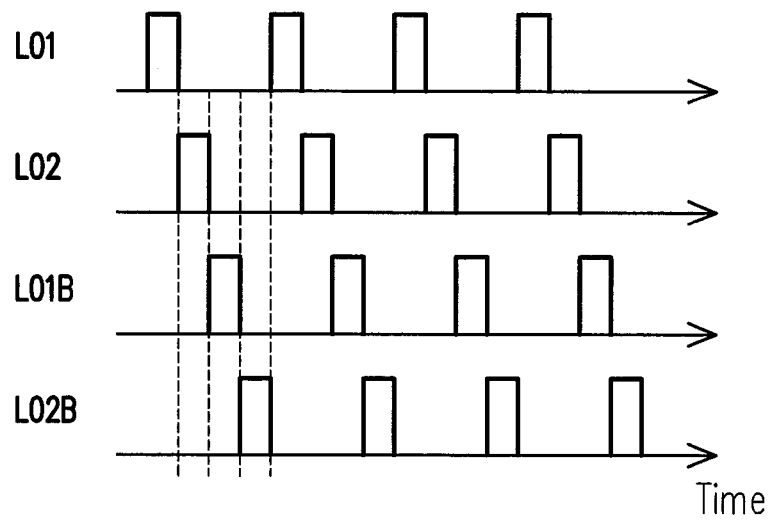

FIG. 5A and FIG. 5B are relationship diagrams of local oscillation signals and duty cycles thereof. FIG. 5A illustrates a situation that duty cycles of the first and second local oscillation signal LO1, LO2 are all one half cycle. In the conventional technique, the local oscillation signals with the duty cycle of one half cycle can be easily obtained, and besides the general oscillation signal generator (not shown), the other circuit components are unnecessary to be additionally configured. However, in the RF front-end circuit of the conventional technique, since the low noise amplifier only has two RF output signals with a phase difference of 180 degrees, the frequency mixer generally has two frequency mixing units (for example, the first and second frequency mixing unit 210, 230) sharing the same RF output signal. In this way, as shown in FIG. 5A, the first and second local oscillation signal LO1, LO2 with the duty cycle of one half cycle are overlapped by a quarter cycle. Namely, in the quarter cycle, the two frequency mixing units connected to the output node of the low noise amplifier (for example, the first and second frequency mixing unit 210, 230) share the same RF output signal, and the two quadrature frequency mixing units are simultaneously turn on, so that the signal and the noise are interfered to each other, which causes signal quality degraded.

In order to avoid the above situation, in the conventional technique structure, the duty cycles of the first and second local oscillation signal LO1, LO2 have to be adjusted to a quarter cycle, so as to avoid the above problem.

However, an additional generation circuit is required in order to adjust the duty cycle to the quarter cycle, and the excessively narrow duty cycle shortens a turn on time of the frequency mixer, and decreases a conversion gain of the frequency mixer, which accordingly decreases a signal-to-noise ratio (SNR) of the RF front-end circuit for receiver. In the structure disclosed by the invention, the low noise amplifier 10 can respectively provide the RF output signals to the differential pairs of the frequency mixing units, even if the duty cycles of the first and second local oscillation signal LO1, LO2 are overlapped to each other, the aforementioned problem of signal interference caused by sharing the RF output signal is avoided, and meanwhile a quarter cycle generation circuit is saved. Moreover, since the differential pairs are used to respectively provide the RF output signals to the frequency mixing units, when the low noise amplifier 10 is coupled to the quadrature passive mixer 200 for impedance matching, a suitable impedance value can be simply adjusted.

In summary, the invention provides a low noise amplifier and a RF front-end circuit including the low noise amplifier, which can independently transmit the RF signals amplified by the low noise amplifier to each of the frequency mixing units to serve as a differential pair for frequency mixing, and even if the duty cycles of the local oscillation signals received by the differential pair are overlapped to each other, the problem of SNR degradation or mutual interference of signal and noise caused by sharing the RF output signal is avoided. On the other hand, the impedance matching between the low noise amplifier and the frequency mixer can be adjusted in a simple manner, which is simple in configuration.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A radio frequency front-end circuit, configured for a receiver, comprising:
    a low noise amplifier, having a first input node, a second input node, a first output node, a second output node, a third output node and a fourth output node, respectively receiving a first radio frequency input signal and a second radio frequency input signal differential to each other through the first input node and the second input node, and respectively outputting a first radio frequency output signal, a second radio frequency output signal, a third radio frequency output signal and a fourth radio frequency output signal through the first output node, the second output node, the third output node and the fourth output node; and
    a quadrature passive mixer, coupled to the first output node, the second output node, the third output node and the fourth output node of the low noise amplifier, and respectively receiving the first radio frequency output signal, the second radio frequency output signal, the third radio frequency output signal and the fourth radio frequency output signal, and mixing with a local oscillation signal to obtain a first baseband signal, a second baseband signal, a third baseband signal and a fourth baseband signal, wherein the low noise amplifier comprises:
        a main differential input pair, having a common node, a first and second input nodes and a first and second differential nodes, wherein the first and second input nodes of the main differential input pair respectively receive the first radio frequency input signal and the second radio frequency input signal differential to each other;
        a main tail current source, coupled between the common node of the main differential input pair and the ground;
        a first sub differential pair, having a common node, a first and second input nodes and a first and second differential nodes, wherein the common node of the first sub differential pair is coupled to the first differential node of the main differential input pair, the first differential node of the first sub differential pair is coupled to a first output impedance and the first output node of the low noise amplifier, and the second differential node of the first sub differential pair is coupled to a second output impedance and the third output node of the low noise amplifier; and
        a second sub differential pair, having a common node, a first and second input nodes and a first and second differential nodes, wherein the common node of the second sub differential pair is coupled to the second differential node of the main differential input pair, the first differential node of the second sub differential pair is coupled to a third output impedance and the second output node of the low noise amplifier, and the second differential node of the second sub differential pair is coupled to a fourth output impedance and the fourth output node of the low noise amplifier,
    wherein the low noise amplifier respectively outputs the first radio frequency output signal, the second radio frequency output signal, the third radio frequency output signal and the fourth radio frequency output signal through the first output node, the second output node, the third output node and the fourth output node.

2. The radio frequency front-end circuit as claimed in claim 1, wherein the low noise amplifier further comprises:
    a first feedback circuit, coupled between the first input node and the first differential node of the main differential input pair; and
    a second feedback circuit, coupled between the second input node and the second differential node of the main differential input pair.

3. The radio frequency front-end circuit as claimed in claim 1, wherein the main differential input pair comprises:
    a first main transistor, having a gate receiving the first radio frequency input signal, a drain coupled to the first differential node of the main differential input pair, and a source coupled to the common node of the main differential input pair; and
    a second main transistor, having a gate received the second radio frequency input signal, a drain coupled to the second differential node of the main differential input pair, and a source coupled to the common node of the main differential input pair.

4. The radio frequency front-end circuit as claimed in claim 1, wherein the first sub differential pair comprises:
    a first sub transistor, having a gate receiving a first sub differential pair bias, a drain coupled to the first differential node of the first sub differential pair, and a source coupled to the common node of the first sub differential pair; and
    a second sub transistor, having a gate receiving a second sub differential pair bias, a drain coupled to the second differential node of the first sub differential pair, and a source coupled to the common node of the first sub differential pair.

5. The radio frequency front-end circuit as claimed in claim 1, wherein the second sub differential pair comprises:
    a third sub transistor, having a gate receiving a third sub differential pair bias, a drain coupled to the first differential node of the second sub differential pair, and a source coupled to the common node of the second sub differential pair; and
    a fourth sub transistor, having a gate receiving a fourth sub differential pair bias, a drain coupled to the second differential node of the second sub differential pair, and a source coupled to the common node of the second sub differential pair.

6. The radio frequency front-end circuit as claimed in claim 1, wherein the low noise amplifier further comprises:
    a first output impedance, coupled between the first differential node of the first sub differential pair and the power;
    a second output impedance, coupled between the second differential node of the first sub differential pair and the power;
    a third output impedance, coupled between the first differential node of the second sub differential pair and the power; and
    a fourth output impedance, coupled between the second differential node of the second sub differential pair and the power.

7. The radio frequency front-end circuit as claimed in claim 1, wherein the main tail current source module comprises:
    a current source, coupled between the common node of the main differential input pair and the ground.

8. The radio frequency front-end circuit as claimed in claim 1, wherein the local oscillation signal comprises a first local oscillation signal, a second local oscillation signal, an inverted signal of the first local oscillation signal and an inverted signal of the second local oscillation signal; and the quadrature passive mixer further comprises:

a first frequency mixing unit, receiving the first radio frequency output signal and the second radio frequency output signal, and mixing with the first local oscillation signal and the inverted signal of the first local oscillation signal to obtain a first baseband current signal and a second baseband current signal;

a first transimpedance amplifier, coupled to the first frequency mixing unit, and receiving the first baseband current signal and the second baseband current signal and outputting the first baseband signal and the second baseband signal;

a second frequency mixing unit, receiving the third radio frequency output signal and the fourth radio frequency output signal, and mixing with the second local oscillation signal and the inverted signal of the second local oscillation signal to obtain a third baseband current signal and a fourth baseband current signal; and a second transimpedance amplifier, coupled to the second frequency mixing unit, and receiving the third baseband current signal and the fourth baseband current signal and outputting the third baseband signal and the fourth baseband signal.

9. The radio frequency front-end circuit as claimed in claim 8, wherein the first frequency mixing unit comprises:

a first differential pair, having a common node, a first and second control nodes and a first and second differential nodes, wherein the common node of the first differential pair receives the first radio frequency output signal, the first control node of the first differential pair receives the first local oscillation signal, and the second control node of the first differential pair receives the inverted signal of the first local oscillation signal, and the first and second differential nodes of the first differential pair are coupled to the first transimpedance amplifier; and a second differential pair, having a common node, a first and second control nodes and a first and second differential nodes, wherein the common node of the second differential pair receives the second radio frequency output signal, the first control node of the second differential pair receives the inverted signal of the first local oscillation signal, and the second control node of the second differential pair receives the first local oscillation signal, and the first and second differential nodes of the second differential pair are coupled to the first transimpedance amplifier.

10. The radio frequency front-end circuit as claimed in claim 8, wherein the second frequency mixing unit comprises:

a third differential pair, having a common node, a first and second control nodes and a first and second differential nodes, wherein the common node of the third differential pair receives the third radio frequency output signal, the first control node of the third differential pair receives the second local oscillation signal, and the second control node of the third differential pair receives the inverted signal of the second local oscillation signal, and the first and second differential nodes of the third differential pair are coupled to the second transimpedance amplifier; and a fourth differential pair, having a common node, a first and second control nodes and a first and second differential nodes, wherein the common node of the fourth differential pair receives the fourth radio frequency output signal, the first control node of the fourth differential pair receives the inverted signal of the second local oscillation signal, and the second control node of the fourth differential pair receives the second local oscillation signal, and the first and second differential nodes of the fourth differential pair are coupled to the second transimpedance amplifier.

11. The radio frequency front-end circuit as claimed in claim 8, wherein the first transimpedance amplifier comprises:

a first operational amplifier, having an input node and an output node, and coupled to the first and second differential pairs of the first frequency mixing unit, wherein the input node receives the first baseband current signal and the second baseband current signal, and after buffer processing, the output node outputs the first baseband signal and the second baseband signal;

at least one resistor, coupled between the input node and the output node of the first transimpedance amplifier; and at least one capacitor, coupled between the input node and the output node of the first transimpedance amplifier.

12. The radio frequency front-end circuit as claimed in claim 8, wherein the second transimpedance amplifier comprises:

a second operational amplifier, having an input node and an output node, and coupled to the third and fourth differential pairs of the second frequency mixing unit, wherein the input node receives the third baseband current signal and the fourth baseband current signal, and after buffer processing, the output node outputs the third baseband signal and the fourth baseband signal;

at least one resistor, coupled between the input node and the output node of the first transimpedance amplifier; and at least one capacitor, coupled between the input node and the output node of the first transimpedance amplifier.

13. The radio frequency front-end circuit as claimed in claim 8, wherein duty cycles of a first local oscillation signal and a second local oscillation signal are one half, wherein the duty cycles of the first local oscillation signal and the second local oscillation signal are overlapped to each other.

14. A low noise amplifier, having a first output node, a second output node, a third output node and a fourth output node, and comprising:

a main differential input pair, having a common node, a first and second input nodes and a first and second differential nodes, wherein the first and second input nodes of the main differential input pair respectively receive a first radio frequency input signal and a second radio frequency input signal differential to each other;

a main tail current source module, coupled between the common node of the main differential input pair and the ground;

a first sub differential pair, having a common node, a first and second input nodes and a first and second differential nodes, wherein the common node of the first sub differential pair is coupled to the first differential node of the main differential input pair, the first differential node of the first sub differential pair is coupled to a first output impedance and the first output node of the low noise amplifier, and the second differential node of the first sub differential pair is coupled to a second output impedance and the third output node of the low noise amplifier; and a second sub differential pair, having a common node, a first and second input nodes and a first and second differential nodes, wherein the common node of the second sub differential pair is coupled to the second differential node of the main differential input pair, the first differential node of the second sub differential pair is coupled to a third output impedance and the second output node of the low noise amplifier, and the second differential node of the second sub differential pair is coupled to a fourth output impedance and the fourth output node of the low noise amplifier.

15. The low noise amplifier as claimed in claim 14, further comprising:
- a first feedback circuit, coupled between the first input node and the first differential node of the main differential input pair; and
- a second feedback circuit, coupled between the second input node and the second differential node of the main differential input pair.

16. The low noise amplifier as claimed in claim 14, wherein the main differential input pair comprises:
- a first main transistor, having a gate receiving the first radio frequency input signal, a drain coupled to the first differential node of the main differential input pair, and a source coupled to the common node of the main differential input pair; and
- a second main transistor, having a gate receiving the second radio frequency input signal, a drain coupled to the second differential node of the main differential input pair, and a source coupled to the common node of the main differential input pair.

17. The low noise amplifier as claimed in claim 14, wherein the first sub differential pair comprises:
- a first sub transistor, having a gate receiving a first sub differential pair bias, a drain coupled to the first differential node of the first sub differential pair, and a source coupled to the common node of the first sub differential pair; and
- a second sub transistor, having a gate receiving a second sub differential pair bias, a drain coupled to the second differential node of the first sub differential pair, and a source coupled to the common node of the first sub differential pair.

18. The low noise amplifier as claimed in claim 14, wherein the second sub differential pair comprises:
- a third sub transistor, having a gate receiving a third sub differential pair bias, a drain coupled to the first differential node of the second sub differential pair, and a source coupled to the common node of the second sub differential pair; and
- a fourth sub transistor, having a gate receiving a fourth sub differential pair bias, a drain coupled to the second differential node of the second sub differential pair, and a source coupled to the common node of the second sub differential pair.

19. The low noise amplifier as claimed in claim 14, further comprising:
- a first output impedance, coupled between the first differential node of the first sub differential pair and the power;
- a second output impedance, coupled between the second differential node of the first sub differential pair and the power;
- a third output impedance, coupled between the first differential node of the second sub differential pair and the power; and
- a fourth output impedance, coupled between the second differential node of the second sub differential pair and the power.

20. The low noise amplifier as claimed in claim 14, wherein the main tail current source module comprises:
- a current source, coupled between the common node of the main differential input pair and the ground.

* * * * *